United States Patent [19]

Gockler

[11] Patent Number: 4,839,889
[45] Date of Patent: Jun. 13, 1989

[54] DIGITAL FILTER TREE

[75] Inventor: Heinz Gockler, Backnang, Fed. Rep. of Germany

[73] Assignee: ANT Nachrichtentechnik GmbH, Backnang, Fed. Rep. of Germany

[21] Appl. No.: 246,692

[22] Filed: Sep. 20, 1988

Related U.S. Application Data

[63] Continuation-in-part of Ser. No. 29,768, Mar. 24, 1987, Pat. No. 4,792,943.

[30] Foreign Application Priority Data

Mar. 26, 1986 [DE] Fed. Rep. of Germany ....... 3610195
Sep. 24, 1987 [DE] Fed. Rep. of Germany ....... 3732085

[51] Int. Cl.$^4$ .............................................. H04J 1/02
[52] U.S. Cl. ......................................... 370/70; 370/50
[58] Field of Search .................. 370/50, 70, 19, 23, 370/123

[56] References Cited

U.S. PATENT DOCUMENTS 4,393,456 7/1983 Marshall, Jr. .......................... 370/70
4,412,325 10/1983 Molo ..................................... 370/70

OTHER PUBLICATIONS

J. H. McClellan et al., "A Computer Program for Designing Optimum FIR Linear Phase Digital Filters," *IEEE Transactions on Audio and Electroacoustics*, vol. AU-21, No. 6, Dec. 1973, pp. 506-526.

*Primary Examiner*—Robert L. Griffin
*Assistant Examiner*—Wellington Chin
*Attorney, Agent, or Firm*—Spencer & Frank

[57] ABSTRACT

The invention relates to a digital filter tree composed of a plurality of digital filter banks arranged in a tree structure one behind the other to branch out in stages with a separation into $L_\nu$ individual signals taking place in each stage and the sampling rate being reduced each time by the factor $M_\nu$ where $\nu=1,2,\ldots$ identifies the $\nu$th stage. The filter tree employs a prototype filter with half-band functions for channel center frequencies $f_l = l \cdot B + B/2$, with a real frequency multiplex input signal being separated into $L_\nu$ complex channel signals for further processing by means of a discrete Fourier transformation. For all stages $M_\nu = 2$ and $L_\nu = 4$ are fixed, with only two signals of the $L_\nu = 4$ being utilized. The arrangement permits adaptation of a hierarchical multi-stage method also to numbers of channels which are not equal to a power of two without changing the input sampling frequency and without the causing channels, whose number is fixed by the difference from the next higher power of two, to idle.

2 Claims, 16 Drawing Sheets

FIG. 10a  HALFBAND PROTOTYPE FILTER FOR ALL STAGES AND DAF ($f_{Si}^0 = f_{Si}$): STAGE NUMBER $\nu$
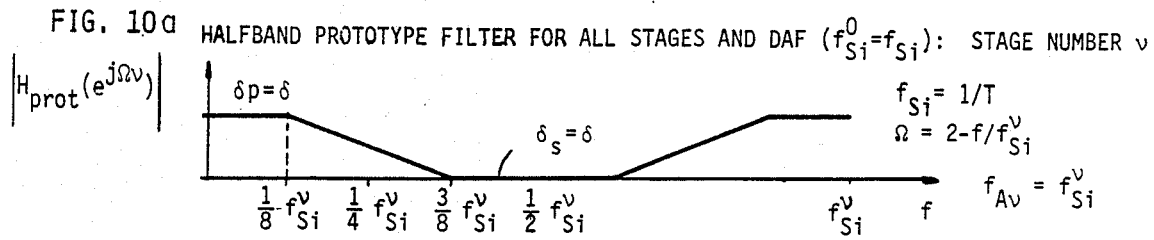
FIG. 10b  DAF ($\nu=0$): Real input and complex output sequence, $B_0 = LB$, $T_1 = 1/f_{Si}^I$
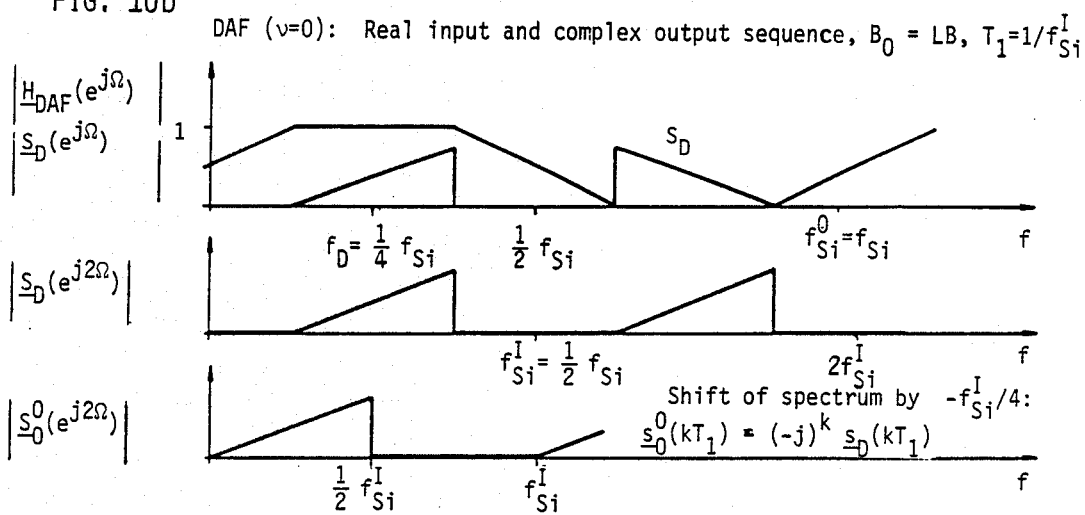
FIG. 10c  STAGES $\nu \neq 0$ : $f_{Si}^\nu = 2f_{Si}^{\nu I}$, $B_\nu = f_{Si}^\nu / 4$
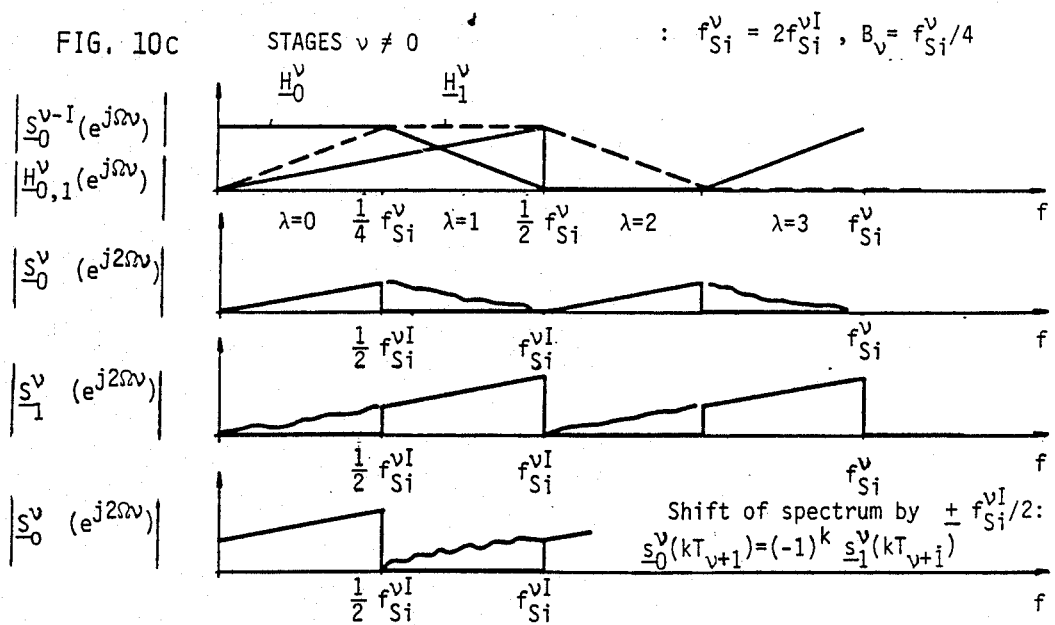

DIGITAL FILTER TREE

REFERENCE TO RELATED APPLICATIONS

This is a continuation-in-part of applicant's copending U.S. patent application Ser. No. 029,768, filed Mar. 24, 1987, U.S. Pat. No. 4,792,943.

BACKGROUND OF THE INVENTION

The present invention relates to a tree arrangement of digital filter banks, and more particularly to a tree of digital filter banks for frequency multiplex signals.

Such digital filter banks as may be used in the present invention demultiplex and multiplex digitalized frequency multiplex signals. Prior digital banks of this type are disclosed, for example, in an article by F. M. Gardner "On-Board Procesing For Mobile Satellite Communications", published in Final Report: ESTEC Contract 5889/84, Palo Alto, Calif., Gardner Research Company, May 2, 1985, and in an article, entitled "Comprehensive Survey of Digital Transmultiplexing Methods," by Helmut Scheuermann and Heinz Göckler, in Proceedings of the IEEE 69 of November, 1981, at pages 1419–1450. Among the drawbacks of known digital filter banks of this type are that FFT (fast Fourier transformation) algorithms which are adapted for processing complex signals cannot be used to their best advantage.

Improved digital filter banks are disclosed in the applicant's above-noted copending U.S. patent application No. 029,768, filed Mar. 24, 1987. Such digital filter banks described in detail below are formed in circuit cells which include digital filter banks and permit optimum utilization of FFT algorithms.

The circuit of each cell includes a digital filter bank for effecting conversion between a frequency mulitiplex signal having a sampling rate $f_A$ and L product sums corresponding to the sampled values of the frequency multiplex signal, the pulse response of the filter bank being of finite length, and a discrete Fourier transformation device for effecting conversion between the product sums and L individual complex signals. The sampling rate is reduced by the factor $M \leq L$ in the transformation device so that only every Mth value of the product sums is processed therein. In the filter bank, the frequency multiplex signal is a complex signal; the real portion and the imaginary portion of this signal are delayed in respective delay member chains associated with partial sequences of individual signal values which are sampled at a rate of $f_A/M$. These signal values for the real portion and for the imaginary portion are each multiplied by the coefficients of the pulse response and the latter are each multiplied by complex coefficients and the respective ith complex signals are summed to form the L product sums.

Filter banks of this type make possible optimum use of FFT algorithms and are very efficient, i.e. they require few adders and multipliers with respect to the intended purpose and demands for steepness, transmission and blocking ripple, etc. The above U.S. patent application No. 029,768 also discloses a digital filter tree. That digital filter tree, whose block structure is illustrated in FIG. 8 of the prior application and in slightly simplified form in the FIG. 1 of the drawings appended hereto, characterizes the so-called hierarchical multi-stage method HMM and is designed in such a manner that the stated form can be used for a number of channels corresponding to a power of two. Among the drawbacks of known digital filter trees such as that disclosed in the above U.S. patent application No. 029,768, are that FFT (fast Fourier transformation) algorithms which are adapted for processing complex signals cannot be used to their best advantage.

SUMMARY OF THE INVENTION

A circuit cell to be used in a digital filter tree according to the invention includes a digital filter bank for effecting conversion between a frequency multiplexed signal and a plurality of weighted filter signals, and a discrete Fourier transformation means connected to the respective filter bank. The cells are connected to one another in successive stages in an outwardly branching tree structure such that, starting with the first stage, the frequency multiplexed signal is separated into $L_\nu$ individual complex signals appearing on separate lines at the $\nu$th stage, where $\nu = 1, 2, \ldots$. The Fourier transformation means of each cell effects a discrete Fourier transformation between the weighted filter signals of the cell and the $L_\nu$ individual complex signals, and the sampling rate is reduced at the $\nu$th stage by $M_\nu \leq L_\nu$. For all of the cells, for each cell of the $\nu$th stage: the frequency multiplexed signal contains component signals each associated with a respective individual complex signal and having a bandwidth $B_\nu$: the weighted filter signals have the form $$\underline{y}_\nu(k,q) = \sum_{p=-\infty}^{+\infty} \underline{s}_\nu(k - i_\nu) \cdot \underline{h}(i_\nu) \cdot \exp(j\pi i_\nu/L_\nu),$$

where
$i_\nu = p \cdot L_\nu + q$,
$q = 0, 1, 2, \ldots L_\nu - 1$, and
$i_\nu, p, q = (0, 1, 2, 3, \ldots)$;
the frequency multiplexed signal is $s_\nu(k)$ and has a sampling rate of $f_{A\nu}$; $\underline{h}(i_\nu)$ is a coefficient representing a pulse response of a finite length for $i_\nu = 0, 1, 2 \ldots N_\nu - 1$;
the discrete Fourier transformation has the form $$l_\nu(kM_\nu) = \sum_{q=0}^{L_\nu - 1} \underline{y}_\nu(kM_\nu, q) \cdot \exp(j2\pi q l_\nu/L_\nu) = DFT\{\underline{y}_\nu(kM_\nu, q)\}$$

where $\underline{s}_{l\nu}(kM_\nu)$ represents the individual complex signals and DFT $\{-\}$ is the discrete Fourier transformation, $M_\nu$ is a sampling rate reduction factor, $M_\nu \leq L_\nu$, and the discrete Fourier transformation involves sampling with respect to every $M_\nu$th value of the weighted filter signals.

Each component signal of the frequency multiplexed signal is associated with a respective channel having a channel number, $L_\nu$, and a center channel frequency $f_{l\nu} = l_\nu \cdot B_\nu + B_\nu/2$ and $l_\nu = 0, 1, 2, \ldots L_\nu - 1$. The frequency multiplexed input signal is a complex signal, $\underline{s}_D(kT_\nu) = s_{r\nu}(kT_\nu) + js_{i\nu}(kT_\nu)$ with a real portion $Re = s_{r\nu}(kT_\nu)$ and an imaginary portion $Im = s_{i\nu}(kT_\nu)$, and k is a time factor $= \ldots, -1, 0, +1 \ldots$.

Each filter bank in the $\nu$th stage includes two chains of $N_\nu - 1$ delay members each having a delay of $T_{\nu+1}$ and each processing a respective portion of the complex signal, where $N_\nu$ is the number of samples of the frequency multiplexed signal associated with each set of weighted filter signal values output by the filter banks of the $\nu$th stage and $T_\nu = 1/f_{A\nu}$. Each filter bank also includes: (1) sampling means for sampling the signals associated with each delay member at a rate corresponding to the sampling rate of the frequency multiplexed signal reduced by $M_\nu$; (2) a first processing means for effecting conversion between each sample signal associated with a given delay member and an associated weighted sample signal; and (3) a second processing means for effecting conversion between selected weighted filter signals and selected weighted sample signals.

It is the object of the invention to provide a digital filter tree of the above-mentioned type which makes it possible to modify the hierarchical multi-stage method HMM in such a manner that the total number of channels to be demultiplexed is increased from the power of two $L_0 = 2^i$ to $L'$, where $L_0 < L' < 2L_0$ and with the input sampling frequency $f_{Ao} = 4L_0.B$ being retained, where B is the channel bandwidth. This should also be possible without the demultiplexer being designed for the next higher power of two, $2.L_0$, in which case $2L_0 - L'$ channels would be idle. The realization of this objective should be as inexpensive as possible.

This may be accomplished by modifying the prior tree structure as disclosed, for example in the above copending U.S. patent application No. 029,768, so that for all stage $\nu$, the reduction in the sampling rate from stage to stage is a constant value $M_\nu = 2$ and the number of complex signals output by each filter bank in each stage is a constant value $L_\nu = 4$, and the frequency mulitplex signal for the first stage at the input side is real and the sampling rate at the input of this first stage is cut in half. In accordance with another aspect of the invention, in addition to the sampling rate reduction factor $M_\nu$ being equal to 2 and the number of individual complex signals appearing on separate lines $L_\nu$ being equal to 4 for all stages $\nu$, the first stage ($\nu = 1$) forms a true four-branch system having four output signals $\underline{s}_0(2kT_1)$, $\underline{s}_1(2kT_1)$, $\underline{s}_2(2kT_1)$, $\underline{s}_3(2kT_1)$, are each fed to the subsequent stage; only two output signals of each of the cells of the next following stages are input to subsequent stages; and the circuit further includes: (1) a prefilter having an output coupled to the first stage ($\nu = 1$) for producing the complex input signal $\underline{s}_D$ to the first stage by sampling at the rate $2f_{A1}$ from a real frequency multiplex input signal $s_D(kT_0)$, $T_0 = T = 1/f_{A0}$, and (2) means for spectrally offsetting the two partial spectra of $\underline{s}_1$ and $\underline{s}_3$ output by the first stage, which do not come to lie directly in the band 0 to $f_{A1}/4$.

The present digital filter tree has the advantages that the hierarchical mulit-stage method HMM can be used unrestrictedly for general applications, i.e. also for numbers of channels which not equal a power of two. The realization is inexpensive and the input sampling frequency remains in effect. A further advantage is that the structure is made more uniform in that exclusively identical HMM cells are required so that the circuit becomes very well suitable for integrated realization.

BRIEF DESCRIPTION OF THE DRAWINGS

These and other features and advantages of the invention will be more completely understood from the following detailed description of the preferred embdodiments with reference to the accompany drawings in which:

FIGS. 10a-c are diagrams of several frequency spectra generated during signal processing by the hierarchiacal multistage tree structure of FIG. 8;

DESCRIPTION OF THE PREFERRED EMBODIMENTS

Figure 2:
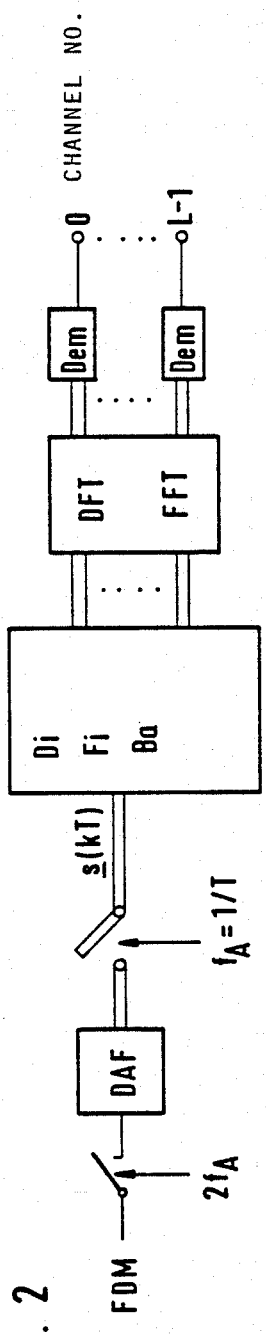
FIG. 2 is a circuit diagram of a filter circuit including the digital filter bank of FIG. 1.

The block in the center of FIG. 2 represents a digital filter bank DiFiBa. It is fed by a complex frequency multiplex signal $\underline{s}(kT)$ which, as shown by the example of FIG. 2, is generated by oversampling at a rate $2f_A$ from a frequency multiplex signal FDM and subsequent filtering by means of a digital anti-aliasing filter DAF, followed by normal sampling at a rate $f_A = 1/T$. The term k represents a time factor, $= \ldots -2, -1, 0, +, +2 \ldots$, representative of the moment of each signal element.

The digital filter bank generates L complex signals which are then again processed, by means of a DFT (discrete Fourier transformation) or FFT processor, into L complex signals which are each demodulated on an individual channel by means of a respective demodulator Dem.

Figure 1:
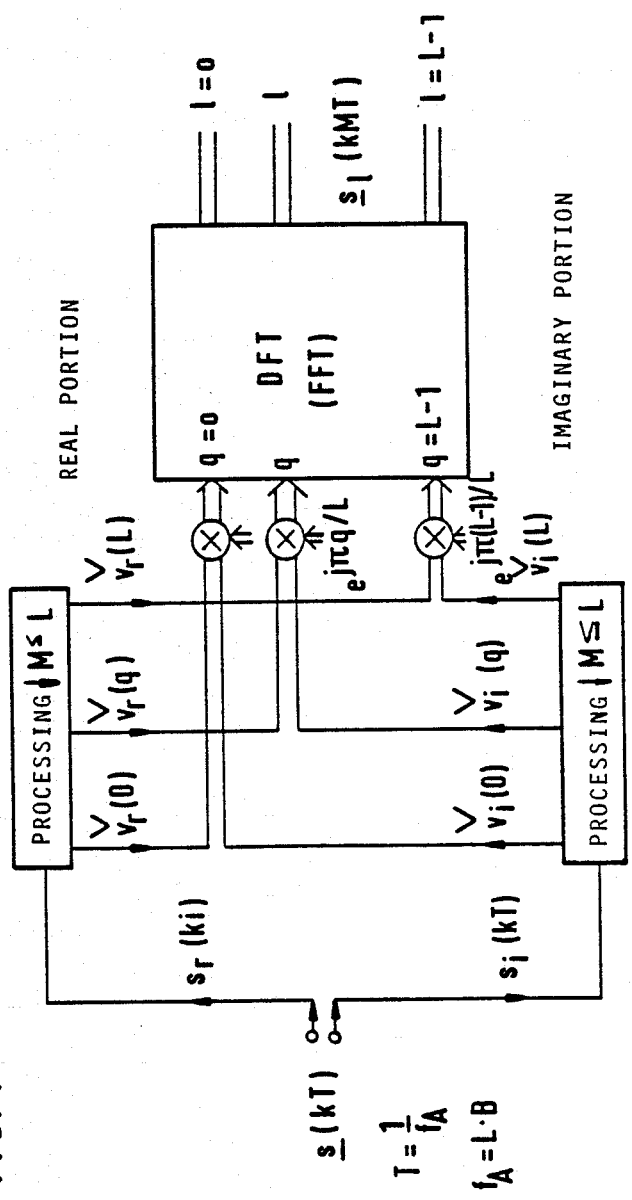
FIG. 1 is a block circuit diagram of a circuit cell portion including a digital filter bank which may be used in the digital filter tree according to the invention.

FIG. 1 is a block circuit diagram showing the digital filter bank composed of a block for the real portion and a block for the imaginary portion of the complex frequency multiplex signal. By processing at a low sampling rate, indicated by a perpendicularly downwardly oriented arrow, with a reduction factor $M \leq L$, these blocks generate product sums $v_r(0) \ldots v_r(L)$ from the real portion of signal $\underline{s}$ and $v_i(0) \ldots v_i(L)$ from the imaginary portion of signal $\underline{s}$ to serve as the L complex input signals for the subsequent discrete or fast Fourier transformation. This applies for channel center frequencies $f_l = l \cdot B$, where l is the consecutive channel number and B the channel bandwidth.

For channel center frequencies $f_l = l \cdot B + B/2$, the complex output signals of the two filter blocks must still be multiplied by the complex factor $\exp(j\pi q/L)$, $q = 0 \ldots L-1$, before they are fed to the Fourier transformer, as shown in FIG. 1, where the L input signals to the Fourier Transformer (DFT) are distinguished by the index q and its L output signals by index 1.

Figure 3:
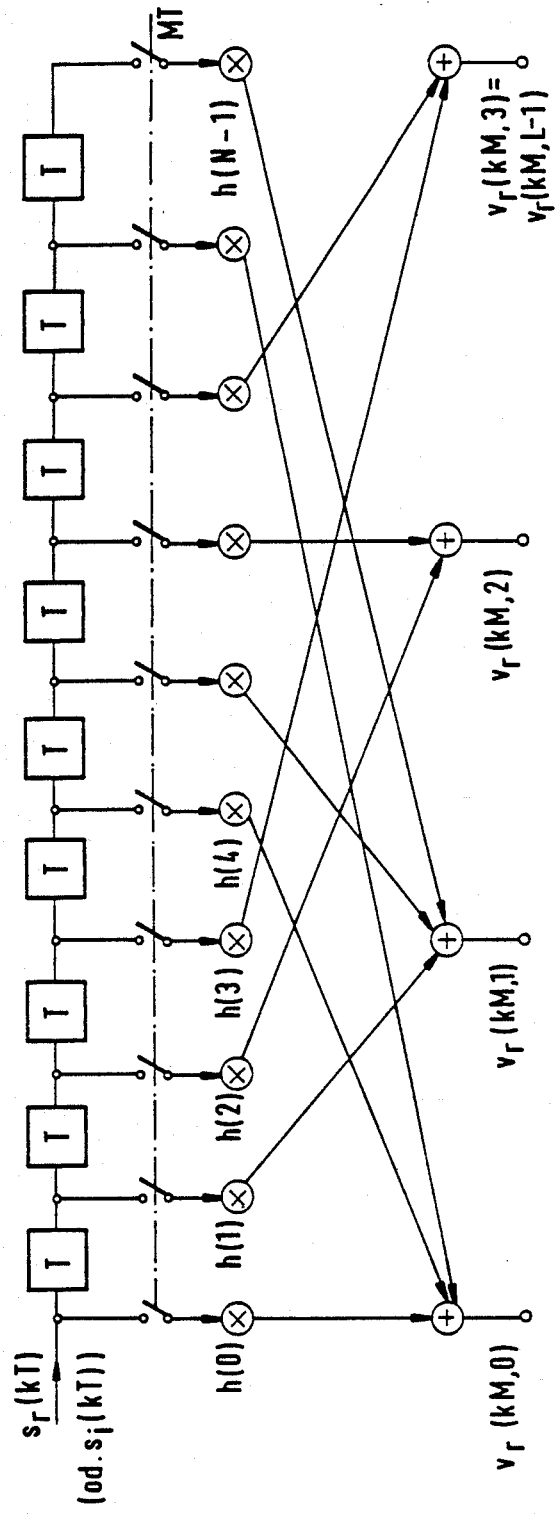
FIG. 3 is a diagram of a circuit arrangement of part of the digital filter bank of FIG. 2.

FIG. 3 shows a processing block of the digital filter bank of FIG. 1 composed of a chain of $N-1 = 9$ delay members each producing a time delay of T. The real portion $s_r(kT)$, of the complex input signal, or the imaginary portion $s_i(kT)$, enters into one end of this chain. The $N = 10$ sampling values of the signal sequence are sampled at a sampling rate $1/(MT)$ and are each multiplied by a coefficient $h(0), \ldots h(N-1)$ of the pulse response of the complex filter. Since $1/T$ represents the input sampling rate of the system and $1/(MT)$ its output sampling rate, M is the decimation ratio of the system. In essence, it can be set to an arbitrary integer with $M \leq L$.

Then the products of $h(0), h(M) \ldots$ and the products of $h(1), h(1+M) \ldots$ etc. are added in selected combinations to form $L = 4$ product sums $v_r(kM, 0), \ldots v_r(kM, 3)$. The filter coefficients $h(0), h(1), \ldots, h(N-1)$ are obtained with standard programs for filter synthesis, such as that described by J. H. McClellan et al,.: "A computer program for designing optimum FIR linear phase digital filters", IEEE Trans. Audio Electroacoust. AU-21 (1973) 12, p. 506–526.

The arrangement described above for the real portion is also used for the imaginary portion from which the product sums $v_i(kM, 0), \ldots v_i(kM, 3)$ are produced.

FIGS. 4a–h show the frequency spectra for a digital filter bank having $L = 16$ channels of which only $l = 3$ to 13 are being used. The channel grid is designed for center frequencies $f_l = l \cdot B + B/2$.

FIG. 4a shows the frequency spectrum $s_r$ of the frequency mulitplex signals as a result of analog bandwidth limitation and oversampling at a sampling rate $2f_A$. Channels 3 to 13 are shown in the normal position in the frequency range 0 to $f_A$ and in the inverted position in the frequency range $f_A$ to $2f_A$.

FIG. 4b shows the frequency characteristic of the DAF filter of FIG. 2. It has a transmission behavior of $|H_{DAF}(\exp(j2\pi f/f_A))|$ with complex coefficients and, as shown, is provided with a transmission range that is symmetrical to $f_A/2$, thus making it most economical.

FIG. 4c shows the frequency spectrum $s(\exp(j2\pi f/f_A))$ of the complex signal $s(kT)$ after periodic sampling at $f_A = 1/T$, with all channels 3 to 13 being generated in the normal position in two frequency ranges.

FIG. 4d shows the transfer function $|H_{prot}(\exp(j2\pi f/f_A))|$ with a transmission range of $-B/2$ to $+B/2$ and filter transition regions each having a width B. This transmission characteristic is repeated at the multiples of sampling rate $f_A$.

In FIG. 4e the transfer function is shifted by $fm = l \cdot B = 7B$ as a result of complex modulation with $\exp(j2\pi fm/f_A) = \exp(j2\pi lB/f_A) = \exp(j2\pi l/L)$. The transfer function $|H_{prot}(\exp(j2\pi f/f_A))|$ is the transfer function of a prototype filter, as defined in FIG. 4d, from which all other slot transfer functions of the filter bank are derivable.

FIG. 4f shows the result of filtering by means of a filter having the characteristic shown in FIG. 4e. It shows channel 7 in the normal position with vestiges of adjacent channels located at both sides due to the transition regions.

FIGS. 4g and 4h show the frequency positions of channels having an odd number $s_7(\exp(j2\pi Lf/2f_A))$ and an even number $s_8(\exp(j2\pi Lf/\overline{2f_A}))$ after the sampling frequency has been reduced by the factor $M = L/2$.

Figure 5:
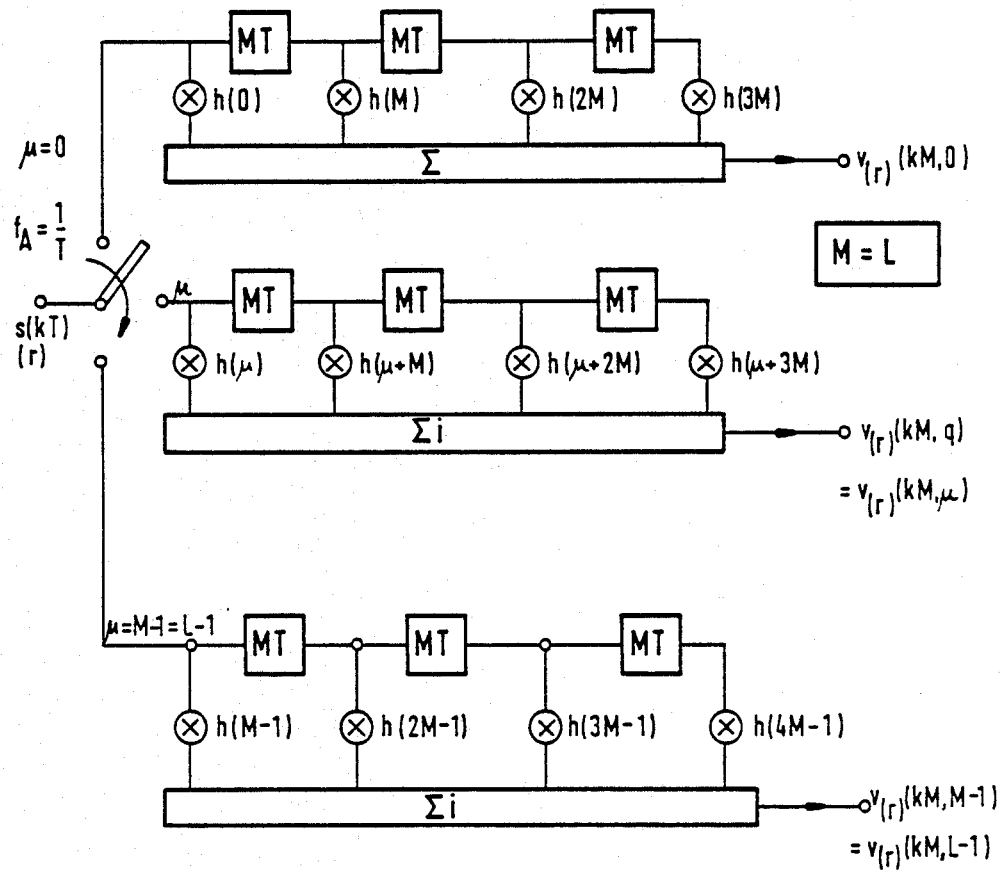
FIGS. 5, 6 and 7 are circuit diagrams of particularly favorable realizations corresponding to FIG. 3 of the digital filter bank.

FIG. 5 shows a polyphase embodiment of the digital filter bank for the special case of $M = L$ and for channel center frequencies $f_l = l \cdot B$ or $f_l = l \cdot B + B/2$. Shown, in representative form is the processing of the real portion of the complex input signal. By means of a demultiplexer, represented by a rotating switch switching from one terminal to the next at the rate $f_A$, this succession of input signals $s_r(kT)$ is distributed at the sampling rate of $f_A = 1/T$ to $M = L$ branches of delay members, each delay member having a delay of $M \cdot T$. In each one of these M branches, every Mth value of the partial sequences is multiplied by the coefficient $h(i)$ where $= \mu + kM$ (for $\mu = 0, 1, \ldots M-1$ and $k = 0, 1, 2, \ldots N/M$) and is then summed to form the individual product sums $v_r(kM, \mu)$.

The descisive advantage of this arrangement is that, except for the input demultiplexer switch, all operations including storage and delay of the data is effected at the reduced output rate $f_A/M$.

Figure 6:
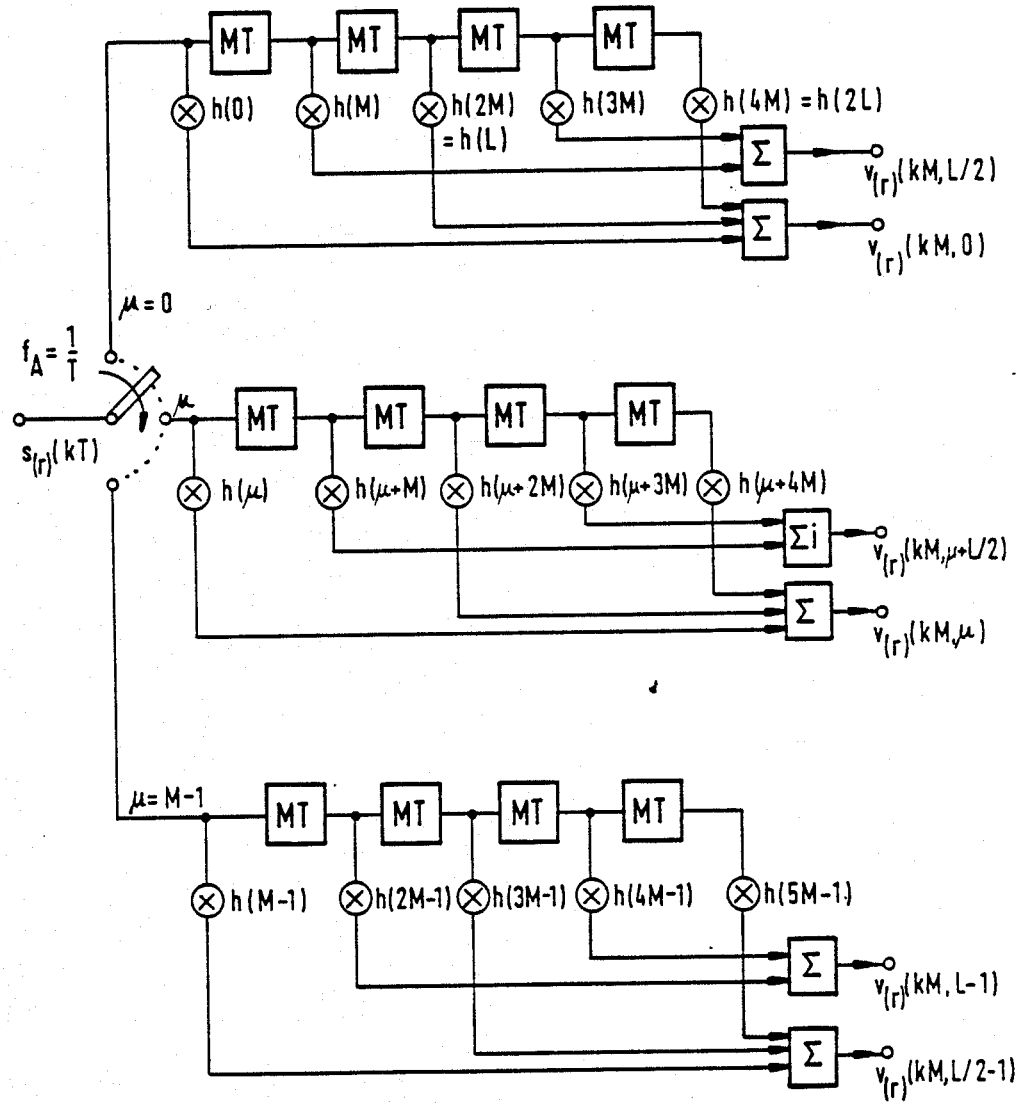

FIG. 6 shows a modified polyphase network where the filter bank according to the invention is realized by M branches, where $M = L/K$, and for channel center frequencies $f_l = l \cdot B$ or $f_l = l \cdot B + B/2$, and where K is an integer number such that the division of the integer L by K results in an integer M.

The processing unit for the real portion $v_r(kT)$ of the complex input signal is again shown by way of example, an identical arrangement being required for the imaginary portion. The input demultiplexer switch distributes the input signal sequence at the sampling rate $f_A = 1/T$ to the $\mu$ branches each having a chain of $N/M - 1$ delay members. In each chain, all Kth values of the partial sequence are combined by means of k summing members to form the signals $v_r(kM, \mu)$ to $v_r(kM, \mu + L/K)$ for $\mu = 0, 1, \ldots, M-1$.

Figure 7:
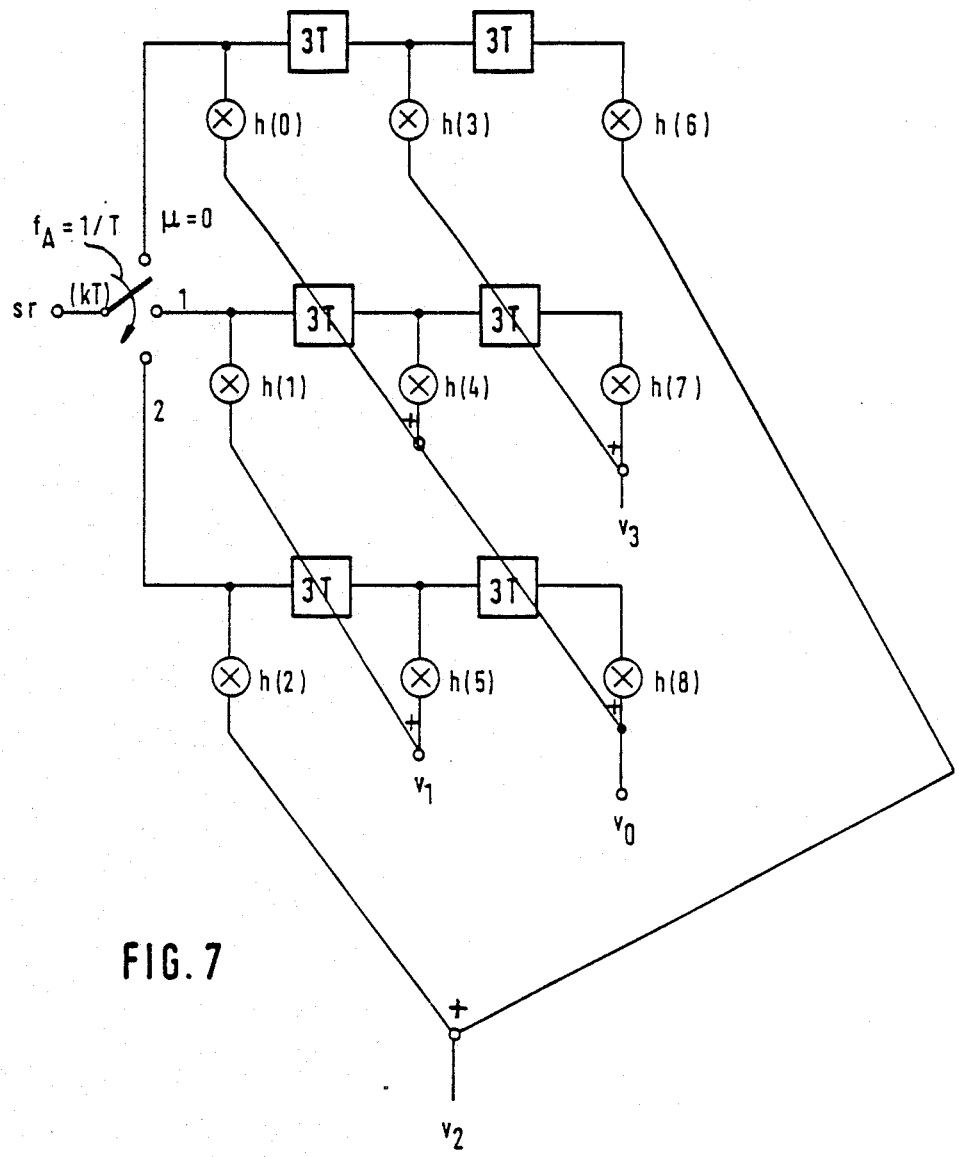

FIG. 7 shows a modified polyphase embodiment of part of the digital filter bank for the case of $L = 4$, $M = 3$, $N = 9$ and for channel center frequencies $f_l = l \cdot B$ or $f_l = l \cdot B + B/2$. The processing unit for the real portion of the complex input signal is shown by way of example. The input sequence is distributed by means of a demultiplexer switch to branches $\mu = 0, 1, 2$, each including two delay members, with each delay member producing a delay of 3T. The individual values of the partial sequences are multiplied, by means of coefficients $h(i)$ of the pulse response of the filter, with $i = 0, 1, \ldots$ to $N - 1 = 8$ and the resulting products are added by means of $L = 4$ summming members to form the product sums $$v0 = h0 + h4 + h8,$$

$$v1 = h1 + h5,$$

$$v2 = h2 + h6, \text{ and}$$

$$v3 = h3 + h7.$$

The terms $h0, h1, h2, \ldots, h8$ are product terms. In accordance with FIG. 7, we have, for instance:

$$h0 = s_r(0 \cdot T) h(0)$$

$$h4 = s_4(4T) h(4)$$

$$h8 = s_r(8T)h(8)$$

or $$v0 = s_r(0 \cdot T) + s_r(4T)h(4) + s_r(8T)h(8).$$

An exemplary set of coefficients h(0), ..., h(8) is:

$$h(0) = h(8) = 0; \ h(1) = h(7) = -0.1112067;$$

$$h(2) = h(6) = 0; \ h(3) = h(5) = 0.5251383;$$
$$h(4) = 0.6155718.$$

Figure 8:
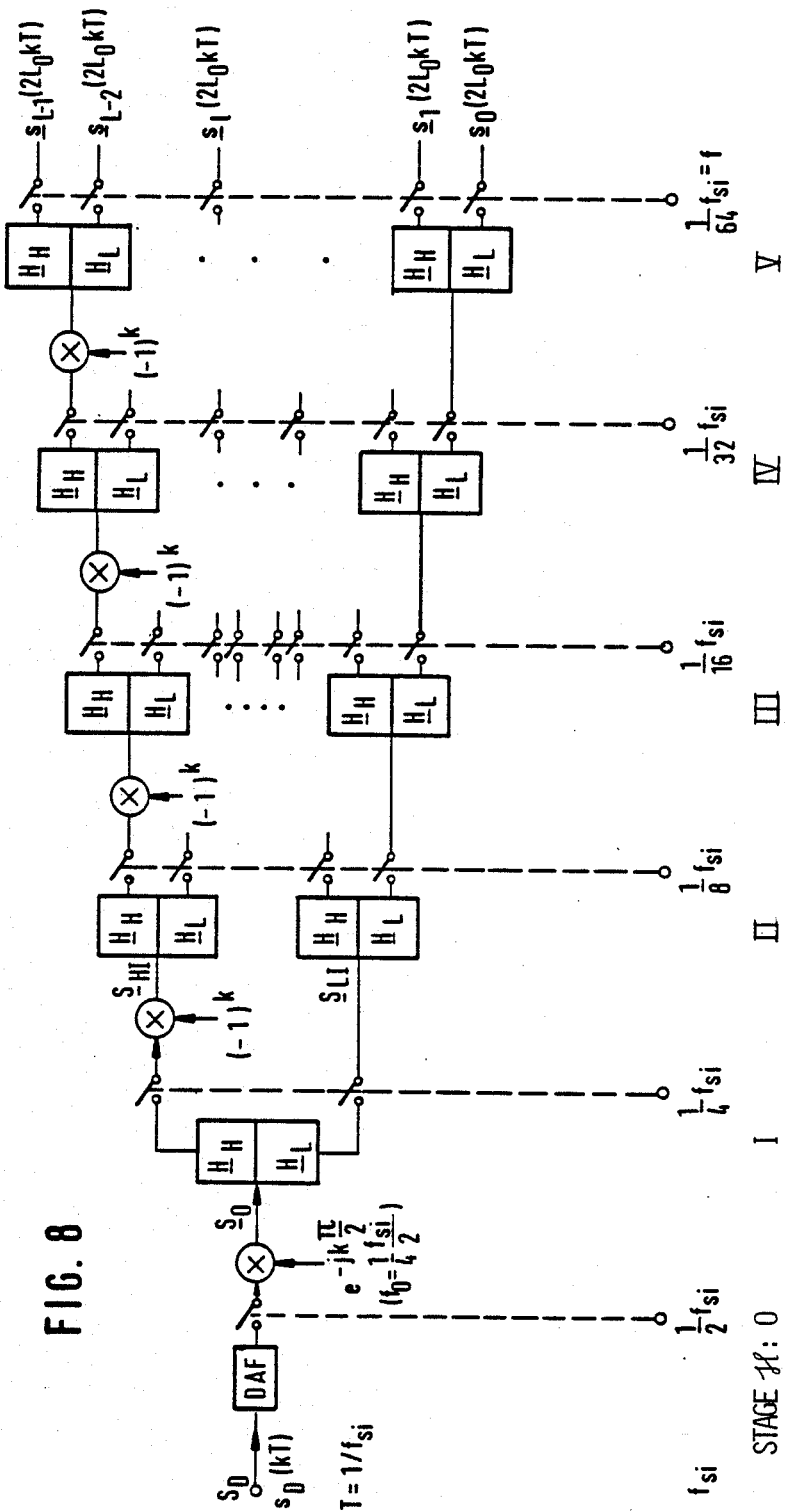
FIG. 8 is a diagram of a hierarchical multistage tree structure employing a plurality of digital filter banks.

FIG. 8 shows a tree structure embodiment in which the complex input signal $S_D(kT)$ is divided into complex individual signals in stages, each stage composed of filters $\underline{H}_1^\nu$ and $\underline{H}_0^\nu$ having complex coefficients, in each stage the sampling rate being half that in the preceding stage.

The blocks of FIG. 8 termed $\underline{H}_0^\nu | \underline{H}_1^\nu$ with $\nu$ representing the $\nu$th stage = I, II, III, IV, V are given by FIG. 1 with L=4, where only two output signals of each block are exploited. $\underline{H}_0^\nu$ represents the transfer function fo a complex lowpass filter and $\underline{H}_1^\nu$ that of a complex bandpass filter, as defined in the characteristics shown in FIG. 10c. All these filters have complex coefficients, indicated by the underlining of the respective quantities. Furthermore, FIG. 10a shows again the frequency response of the prototype filter $H_{prot}$, from which the transfer function $\underline{H}_{DAF}$ of the DAF (FIG. 10b) and those of the subsequent stages $\nu \neq 0$ (FIG. 10c) are derived (see FIGS. 1 and 2). All terms beginning with capital S represent spectra at the input of output ports of a stage filter cell $\underline{H}_0^\nu | \underline{H}_1^\nu$, which are depicted in FIGS. 10a–c. The input sampling rate of the overall filter band is given by $f_{si} = 1/T$.

Figure 9:
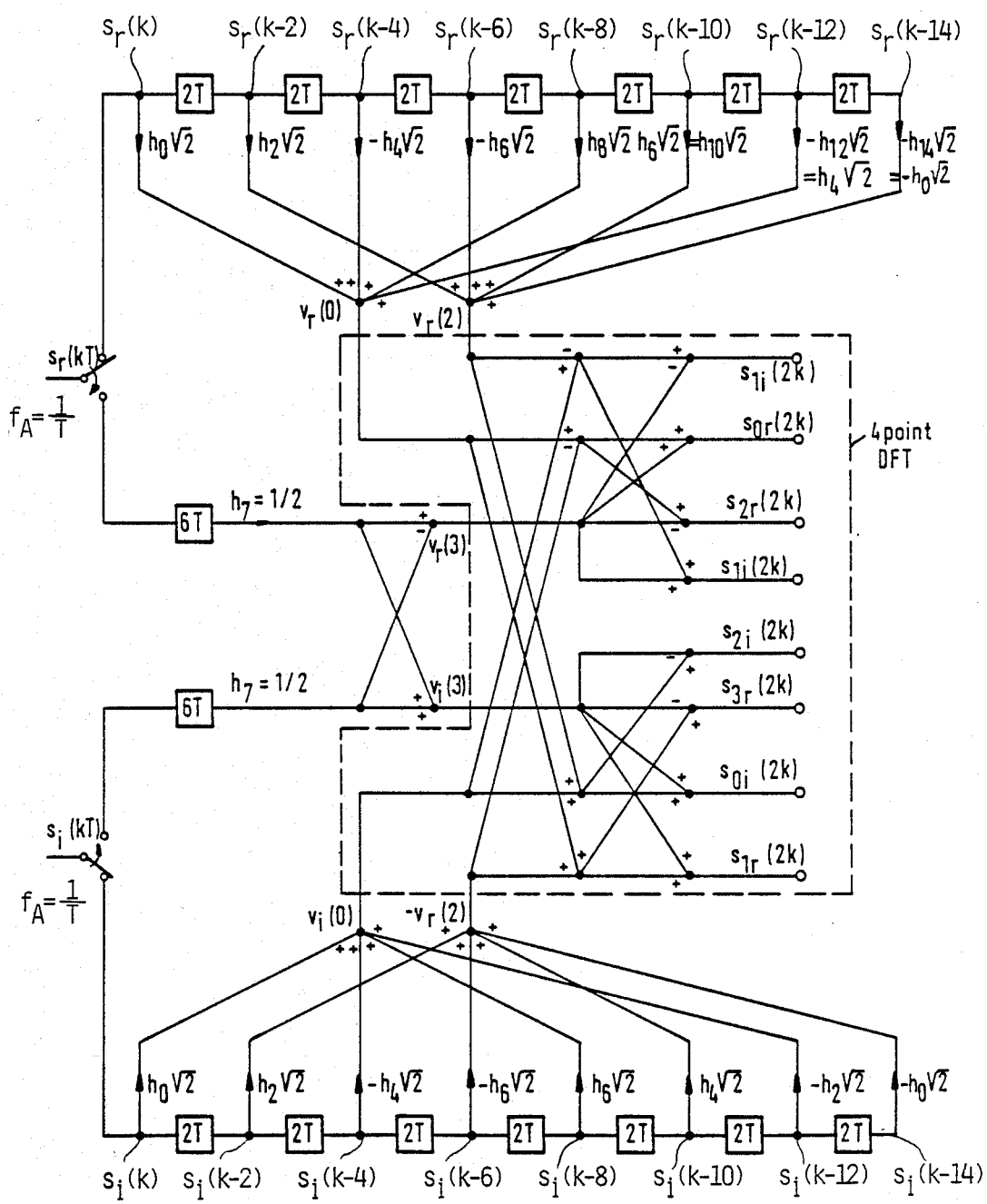
FIG. 9 is a circuit diagram of a particularly favorable optimum circuit arrangement for a digital filter bank.

FIG. 9 shows a particularly economical arrangement of a digital filter bank which additionally results in a particularly economical configuration for the subsequent DFT processor. The arrangement results for L=4, M=2, N=15 (where N=8$\mu$−1, $\mu$ being an integer number as desired) and for channel center frequencies $f_l = l \cdot B + B/2$.

Both a real portion and an imaginary portion are shown, both having identical structures. In the real portion as well as in the imaginary portion, the complex input signal s(kT) is distributed, at the timing of the sampling frequency $f_A = 1/T$, to two chains of delay members. The first chain is composed of (N−1)/2 = 7 delay members each having a delay of 2T and the second chain is composed of a delay member having a delay of T(N−3)/2 = 6T. Since the coefficients h(i) for i = 1, 3, 5, 9, 11, 13 are zero, only the output of this delay member 6T is multiplied by h7 = ½. The sampled values obtained at the first delay chain are multiplied by h0·√2, h2·√2, −h4·√2, −h6·√2 and, since the pulse response in this example is symmetrical, by h8·√2 = h6·√2, h10·√2 = h4·√2, −h12·√2 = −h2·2 and −h14·√2 = −h0·√2. Then, all M second products are summed to $$v_r(0) = \sqrt{2}[h0 \cdot s_r(k) - h4 \cdot s_r(k-4) + h6 \cdot s_r(k-8) - h2 \cdot s_r(k-12)],$$

$$v_i(0) = \sqrt{2}[h0 \cdot s_i(k) - h4 \cdot s_i(k-4) + h6 \cdot s_i(k-8) - h2 \cdot s_i(k-12)],$$

$$-v_r(2) = \sqrt{2}[h2 \cdot s_i(k-2) - h6 \cdot s_i(k-6) + h4 \cdot s_i(k-10) - h0 \cdot s_i(k-14)],$$

$$v_i(2) = \sqrt{2}[h2 \cdot s_r(k-2) - h6 \cdot s_r(k-6) + h4 \cdot s_r(k-10) - h0 \cdot s_r(k-14)],$$

as well as $$v_r(3) = [s_r(7T) - s_i(7T)] \cdot h7 \text{ and}$$

$$v_i(3) = [s_r(7T) + s_i(7T)] \cdot h7.$$

The quantities h0, h2, h4, h6 and h7 are the coefficients of the prototype filter $H_{prot}$, the frequency response of which is defined in FIG. 10a (Filter synthesis as aforementioned). An exemplary set of coefficients is: h0=0, h2=0.018454, h4=−0.090328, h6=0.426544, h7=0.5.

Since $\underline{v}(1)$ is identical to 0, these three complex signals $\underline{v}(0)$, $\underline{v}(2)$ and $\underline{v}(3)$ form the complex input signals for the subsequent DFT processor which needs to perform merely a few summations and subtractions:

$$s_{1r}(2k) = v_r(0) - v_r(2) + v_r(3),$$

$$s_{0r}(2k) = v_r(0) + v_r(2) + v_r(3),$$

$$s_{2r}(2k) = v_r(0) + v_r(2) - v_r(3),$$

$$s_{3r}(2k) = v_r(0) - v_r(2) - v_r(3),$$

$$s_{0i}(2k) = v_i(0) + v_i(2) + v_i(3),$$

$$s_{1i}(2k) = v_i(0) - v_i(2) - v_i(3),$$

$$s_{2i}(2k) = v_i(0) + v_i(2) - v_i(3),$$

and $$s_{3i}(2k) = v_i(0) - v_i(2) + v_i(3).$$

In contrast to FIG. 9, if $\underline{v}(3) = 0$, $\mu$ being an integer number disappears for $N = 8\mu + 3$; instead $\underline{v}(1) \neq 0$. Otherwise the same relationships result.

Now follows a mathematical description of the digital filter bank for complex input and output signals.

The object is to filter out the complex input signal $\underline{s}(kT) = \underline{s}(k)$ from the input spectrum of the frequency multiplex signal by means of the filter $\underline{H}_l(\exp(j2\pi f/f_A))$, having complex coefficients, where $\underline{l}_l(\exp(j2\pi f/f_A))$ represents the transfer function of the digital filter bank for channel 1.

The pulse response (complex terms are underlined)

$$\underline{h}_l(i) = h(i) \exp(j2\pi i l/L), \ i = 0, 1, \ldots, N-1 \quad (1)$$

of the complex filter, derived by means of frequency shifting from the real prototype filter $h(i) = H_{prot}(\exp(j2\pi f/f_A))$, the (complex) output signal results as a product of folding:

$$\underline{S}_l(k) = \sum_{i=\pm\infty}^{\infty} \underline{s}(k-i)\underline{h}_l(i) \quad (2)$$

$$= \sum_{i=-\infty}^{\infty} \underline{s}(k-i)h(i) \, e^{j2\pi i l/L}$$

The desired signal, which is related to the sampling frequency $f_A/M$ reduced by the factor $M \leq L$, then results as follows:

$$\underline{s_l}(kM) = \sum_{i=-\infty}^{\infty} \underline{s}(kM - i)h(i) \, e^{j2\pi i l/L} \quad (3)$$

Blocks of a length L are now formed for suitable processing where $$i = Lp + q, \text{ with } p = -\infty \ldots \infty, \, q = 0, 1, \ldots L-1 \quad (4)$$

Entered into (3), this results in $$\underline{s_l}(kM) = \sum_{q=0}^{L-1} \sum_{p=-\infty}^{\infty} \underline{s}(kM - Lp - q)h(Lp + q)e^{j2\pi(Lp+q)l/L} \quad (5)$$

The exponential term can here be simplified (p, l, L∈N) to $$e^{j2\pi(Lp+q)l/L} = e^{j2\pi pl} e^{j2\pi ql/L} = e^{j2\pi ql/L} \quad (6)$$

By abbreviating the values v(kM,q) which are identical for all l channels there then results:

$$\underline{v}(kM,q) = \sum_{p=-\infty}^{\infty} \underline{s}(kM - pL - q)h(pL + q) \quad (7a)$$

$$\underline{s_l}(kM) = \sum_{q=0}^{L-1} \underline{v}(kM,q)e^{j2\pi ql/L} = DFT\{\underline{v}(kM,q)\} \quad (7b)$$

This is applicable for channel center frequencies $f_l = l \cdot B$.

The realization of Equations (7) is shown essentially in FIGS. 1 and 3. First it is necessary to perform processing (Equation 7a) with the sampling frequency reduced by the factor M to arrive at the complex values v(km,q); see FIG. 3; here, the parts for calculation of the real portion are identical to those for the calculation of the imaginary portion.

The complex values v(kM,q), l=0, ..., L−1 must be subjected, as a block, to a DFT of a length L. This optimally utilizes the efficiency of the DFT algorithm (or any desired FFT algorithm) since complex signals are required as input as well as output values.

Figure 4:
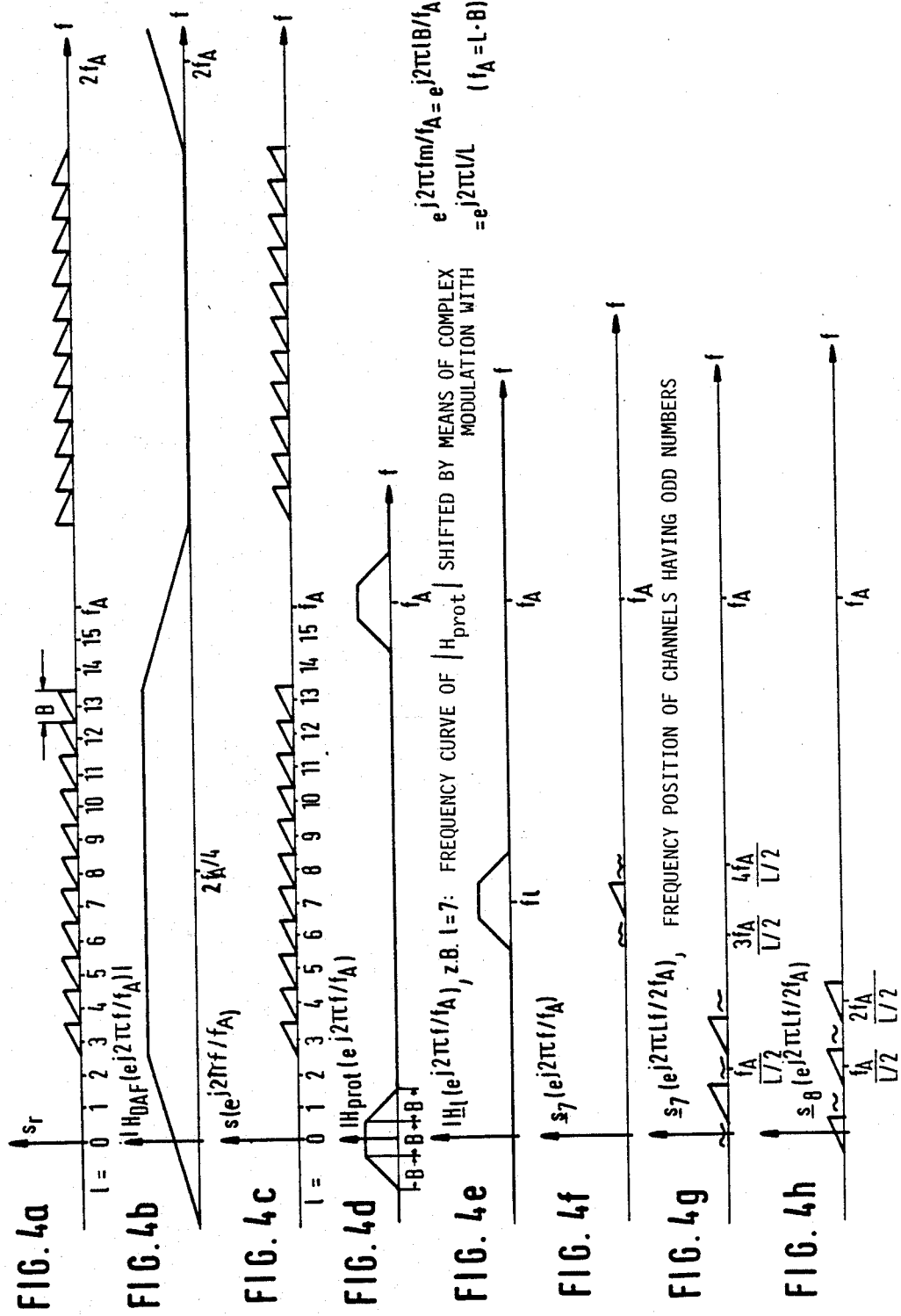
FIGS. 4a-h are diagrams of several frequency spectra generated during signal processing by the digital filter bank.

It is also possible to shift the channel grid by one-half a channel bandwidth or as desired by n/m (n, m∈N; n<m) with respect to FIG. 4, where n and m are integer numbers and n<m.

Then, instead of (1), the following applies:

$$\underline{h_l}(i) = h(i) \exp\left[ j2\pi i \frac{(l + n/m)}{L} \right] \quad (8)$$

$$h_l(i) = h(i) \exp\left[ j2\pi i \frac{(l + n/m)}{L} \right] \quad (8)$$

Then Equation (5) reads as follows:

$$\underline{s_l}(kM) = \sum_{q=0}^{L-1} \sum_{p=-\infty}^{\infty} \underline{s}(kM - pL - q)h(pL + q) \exp\left[ j2\pi \frac{(Lp + q)(l + n/m)}{L} \right] \quad (9)$$

and the exponential term (6) n, m∈N, n<m, becomes $$\exp\left[ j2\pi \frac{(Lp + q)(l + n/m)}{L} \right] = e^{j2\pi ql/L} \, e^{j2\pi pn/m} \, e^{j2\pi(qn/Lm)} \quad (10)$$

Thus, Equations (7a) and (7b) become $$\underline{\overline{v}}(kM,q) = \sum_{p=-\infty}^{\infty} \underline{s}(kM - pL - q)h(pL + q)e^{j2\pi pn/m} \, e^{j2\pi(qn/Lm)} \quad (11a)$$

$$= \sum_{p=-\infty}^{\infty} \underline{s}(kM - pL - q)\underline{h}(pL + q)$$

$$\underline{s_l}(kM) = \sum_{q=0}^{L-1} \underline{\overline{v}}(kM,q)e^{j2\pi ql/L} = DFT\{\underline{\overline{v}}(kM,q)\} \quad (11b)$$

This also applies generally for channel center frequencies $f_l = l \cdot B + B \cdot n/m$.

The complex coefficients $$H(pL + q) = h(pL + q)e^{j2\pi pn/m} e^{j2\pi(qn/Lm)} \quad (11c)$$

take the place of the originally real coefficients h(pL+q), which, for the calculation of the values v(kM,q), corresponds to doubling the original number of multiplications and additions.

For m=2 and m=4, there also exists the possibility of calculating $\overline{v}(kM,q)$ by way of $$\underline{\overline{v}}(kM,q) = \sum_{p=-\infty}^{\infty} \underline{s}(kM - pL - q)h(pL + q)e^{j2\pi pn/m} \quad (12a)$$

where m=2 is $$e^{j2\pi pn/2} = (-1)^{np} \quad (12b)$$

and m=4 is $$e^{j2\pi pn/4} = j^{np} \quad (12c)$$

Thus the effort required to calculate v(kM,q) of Equation (12a) and v(kM,q) of equation (7a) is identical Finally, this results in $$\underline{\overline{v}}(kM,q) = \underline{v}(kM,q)e^{j2\pi(qn/Lm)} \quad (12d)$$

which generally requires an additional four multiplications and two additions for each q=0, 1, ..., L−1, if n≠0. Compared with the effort for Equation (11), the effort for Equation (12) is always less if $$4L < 2N \quad (13)$$

which is frequently the case.

Another possibility for m=2 and m=4 is to combine the factors exp (j2πqn/(Lm)) (Equation 12d) with the DFT to obtain an odd (ODFT), which results in a further reduction of effort.

It is known that any desired digital signal processing network can be converted to a dual function network by transposition. For example, a digital filter bank for the frequency separation of frequency multiplex signals can be converted, by means of the transposition method, into a filter bank for the frequency combination of individual signals into a frequency multiplex signal. For the above described structures, this means that all signal flow directions are reversed (i.e. exchange of input and output, adder becomes branching member, branching member becomes adder, DFT becomes inverse DFT). The method of transposing digital networks is described in the article entitled, "On The Transposition Of Linear Time-Varying Discrete-Time Networks And Its Application To Multirate Digital Systems", Philips J. Res., Volume 33, 1978, pages 78-102.

Figure 11:
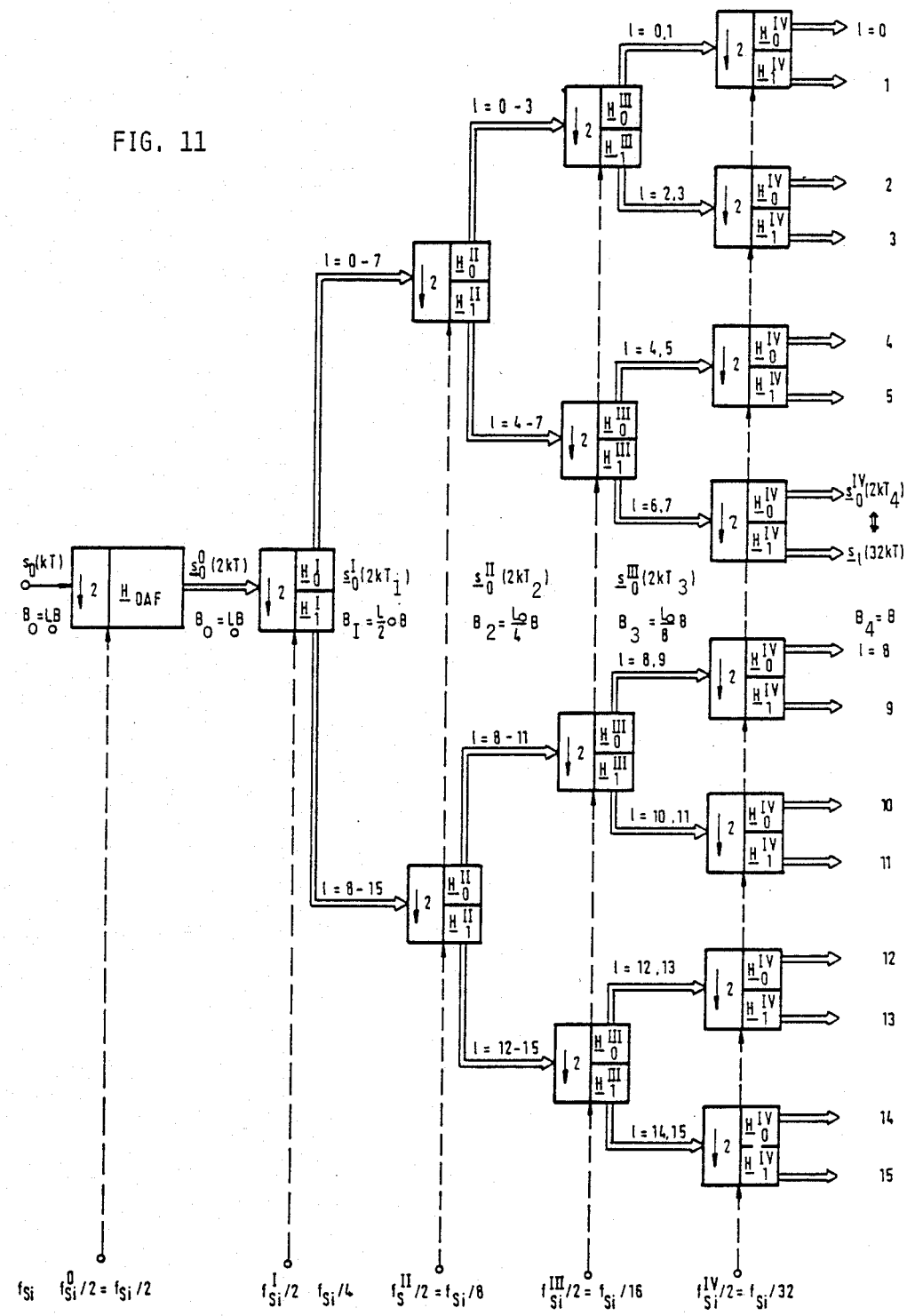
FIG. 11 is a simplified circuit diagram of the tree structure shown in FIG. 8 for a demultiplexer for 16 channels.

FIG. 11 is a simplified circuit diagram of the tree structure shown in FIG. 8 for a demultiplexer for 16 channels. The digital filter tree includes all identical cells $\underline{H}_0$ and $\underline{H}_1$ and has an anti-aliasing filter DAF at its input. The complex signal $\underline{s}_0(2kT)$ produced by means of the DAF filter from the real input signal $s_D(kT)$ is here divided into complex individual signals. This division occurs in stages each employing the stated filters $\underline{H}_0$ and $\underline{H}_1$ with complex coefficients and by each time cutting the sampling rate in half.

FIG. 10a shows again the frequency response of the prototype filter $H_{prot}$, from which the transfer function $\underline{H}_{DAF}$ of the DAF (FIG. 10b) and those of the subsequent stages $\nu \neq 0$ (FIG. 10c) are derived (see FIGS. 1 and 2). All terms beginning with capital S represent spectra at the input and output ports of a stage filter cell $\underline{H}_0^\nu | \underline{H}_1^\nu$, which are depicted in FIGS. 10a-c. The input sampling rate of the overall filter bank is given by $f_{Si} = 1/T = f_{A0}$.

From FIGS. 10a-c which show the spectral relationships it is evident that the DAF filter as well as all cells $\underline{H}\lambda$ are derived from the same prototype filter.

In detail, the following is shown in:

FIG. 10a, the spectrum of the halfband prototype filter for all HMM stages $\nu$ and the DAF stage;

FIG. 10b, the spectral relationships at the DAF filter, at the top for the real input sequence $s_D(kT)$ and the transfer function $|\underline{H}_{DAF}(e^{j\Omega})|$ and below it for the complex output sequence $\underline{s}_D(2kT)$ and below it for the frequency shifted spectrum $\underline{S}_0^0(e^{j2\Omega})$.

FIG. 10c shows the spectral relatonships for the HMM stages $\nu =$ I, II, III or IV, also downstream of the DAF filter. The symbol $\lambda$ here represents the slot number of the HMM stage under consideration and $\nu -$ I identifies the preceding stage while $\nu +$ I identifies the next following stage.

The top of the figure shows the transfer functions of the two filters $\underline{H}_0$ and $\underline{H}_1$ as well as the spectra of their complex input signals. Below that is the spectrum of the complex signal of the $\underline{H}_0$ filter and below it the spectrum of the $\underline{H}_1$ filter. At the very bottom is the shifted output spectrum resulting from $\underline{S}_1(\exp(j2\Omega^\nu))$.

Figure 12:
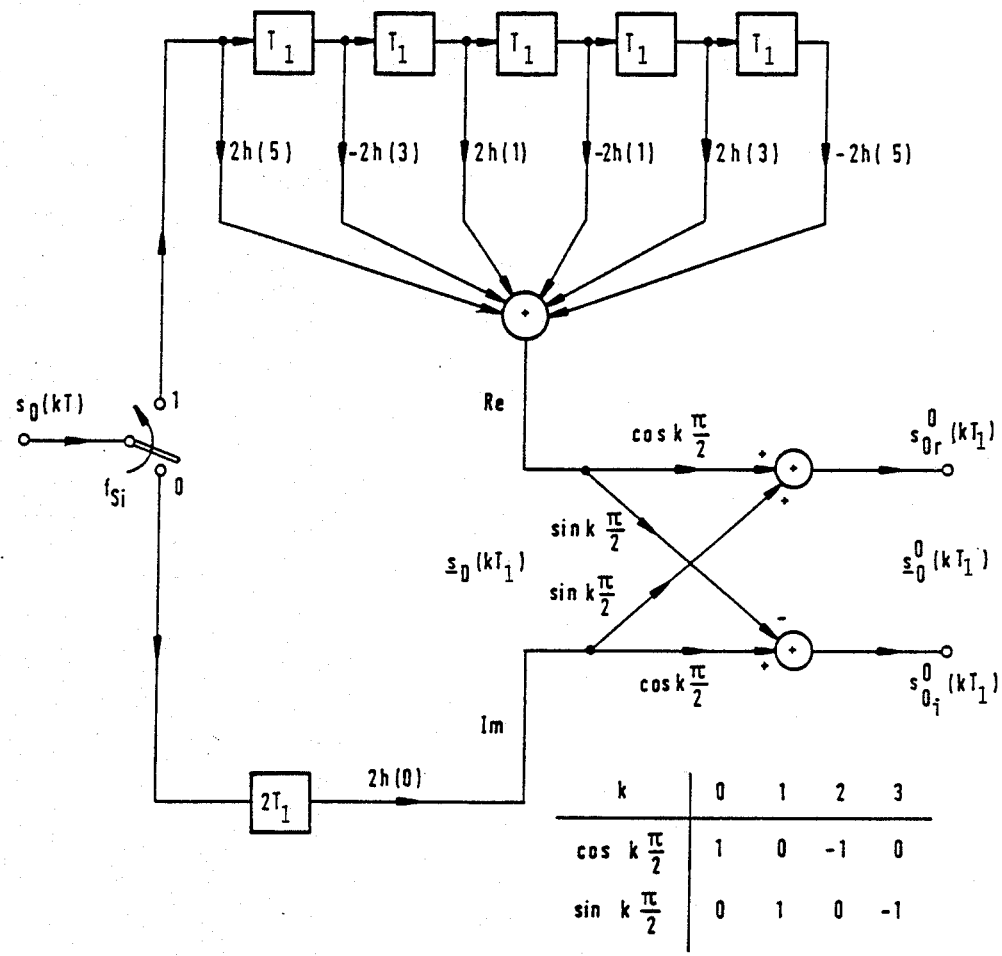
FIG. 12 is a circuit diagram of a DAF filter for use in the digital filter bank of FIG. 2, in which a complex output sample value is furnished of every pair of two successive samples of the input sequence.

FIG. 12 is a circuit diagram of a DAF filter for use in the digital filter bank of FIG. 2, in which a complex output sample value is furnished for every pair of two successive samples of the input sequence.

Figure 13:
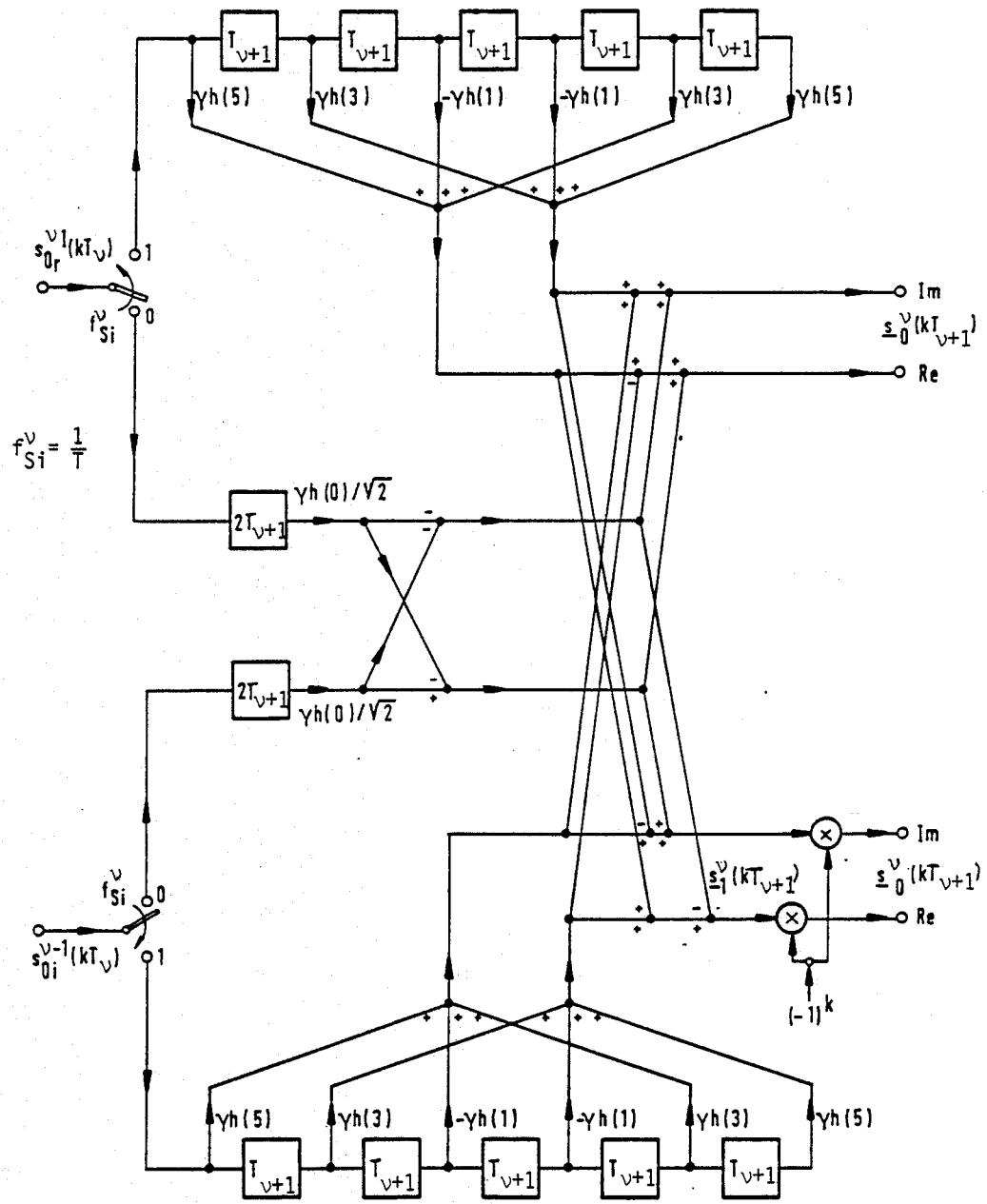
FIG. 13 shows a block structure of a simplified arrangement of the digital filter bank, similar to that shown in FIG. 9.

FIG. 13 shows a block structure of a simplified arrangement of the digital filter bank, similar to that shown in FIG. 9, as an example for filters $\underline{H}_0$ and $\underline{H}_1$; it can be used to realize every one of the 15 identical HMM filter cells of the demultiplexer of FIGS. 8 and 11.

In accordance with one aspect of the invention, for all stages $\nu$, the reduction in the sampling rate from stage to stage is a constant value $M_\nu = 2$ and the number of individual complex signals appearing on separate lines at the $\nu$-th stage $L_\nu = 4$ is fixed. Also, (1) the first stage ($\nu = 1$) forms a true four-branch system having four output signals $\underline{s}_0(2kT_1)$, $\underline{s}_1(2kT_1)$, $\underline{s}_2(2kT_1)$, $\underline{s}_3(2kT_1)$, which are each fed to the subsequent stage; (2) only two output signals of each of the cells of the next following stages are input to subsequent stages; and the circuit further includes: (a) a prefilter having an output coupled to the first stage ($\nu = 1$) for producing the complex input signal $\underline{s}_D$ to the first stage by sampling at the rate $2f_{A1}$ from a real frequency multiplex input signal $s_D(kT_0) = s_D(kT)$, and (b) means for spectrally offsetting the two partial spectra of $\underline{s}_1$ and $\underline{s}_3$ output by the first stage, which do not come to lie directly in the band 0 to $f_{A1}/4$.

Figure 14:
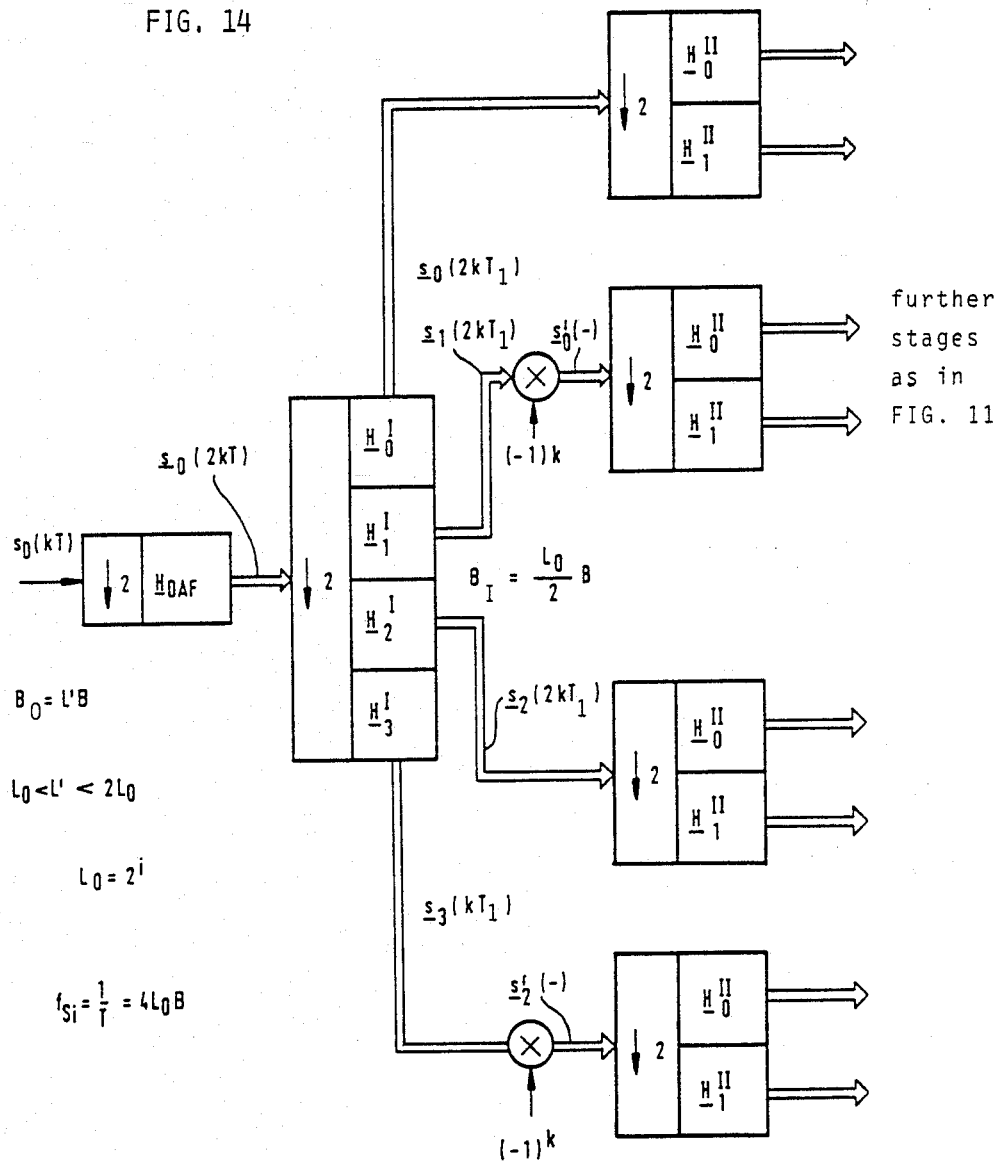
FIG. 14 is a block diagram of the digital filter tree according to one embodiment of the invention.

FIG. 14 shows the block structure of a digital filter tree according to a first embodiment of the present application which functions in the above manner. The associated spectral illustration is given in FIGS. 15a and 15b. The DAF filter is identical with that shown in FIG. 12, omitting the multiplications with sin $k\pi/2$ and cos $k\pi/2$ as well as the subsequent adders. The DAF filter is followed by a cell having four outputs which is identical with the cell shown in FIG. 9. All coefficients could be multiplied with the factor $\gamma/\sqrt{2}$, with $\gamma$ being the general scale factor. The necessary multiplications with $(-1)^k$ are shown in FIG. 4. The remaining cells $\underline{H}_0$ and $\underline{H}_1$ are identical with that shown in FIG. 13.

Figure 15A:
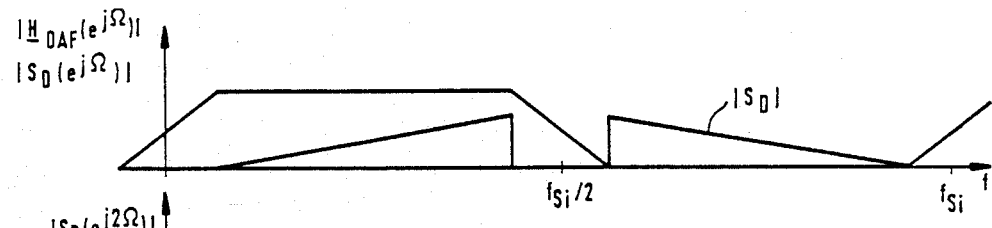
FIGS. 15a and 15b are diagrams of several frequency spectra generated during signal processing by the digital filter tree shown in FIG. 14.
Figure 15B:
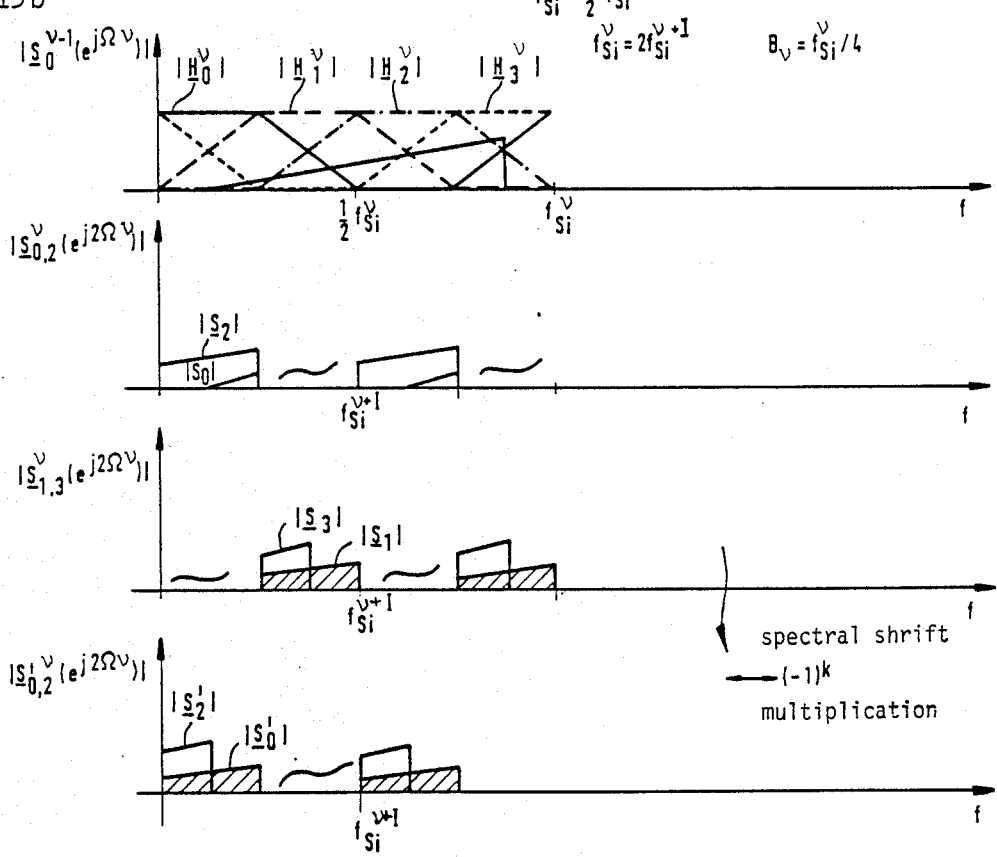

In detail, the spectral representation in FIGS. 15a and 15b shows the following:

the transfer function of the prototype filter for all HMM cells with $\nu =$ I, ..., but not for the DAF filter, corresponds to the diagram of FIG. 10a.

FIG. 15a shows transfer functions $|\underline{H}_{DAF}(e^{j\Omega})|$ and the signal spectra $|\underline{S}_D(e^{j\Omega})|$ and $|\underline{S}_D(e^{j2\Omega})|$ of the DAF filter. Compared with FIG. 10b, it can be noted that, in contrast to the half-band version of FIG. 10b, where the transmission band and the transition region as well as the stop band have the same widths, the pass band according to FIG. 15a is broader, and so is the stop band, and the transition region is shortened correspondingly. In this broadened transmission range, channels are accommodated whose number goes beyond the power of two $L_0$. The lower diagram of FIG. 15a shows the complex signal spectrum $|\underline{S}_D(e^{j2\Omega})|$ after the sampling rate has been cut in half.

FIG. 15b shows the frequency spectra in a manner corresponding to FIG. 10c, here for the four cells of the first stage, with the upper diagram showing the four transfer functions $\underline{H}_0$, $\underline{H}_1$, $\underline{H}_2$ and $\underline{H}_3$ as well as the input signal spectrum.

Below the upper diagram in FIG. 15b are shown the output spectra $\underline{S}_0$ and $\underline{S}_2$, while the diagram therebelow shows the spectra $\underline{S}_1$ and $\underline{S}_3$. The lowermost diagram of FIG. 15b shows the spectra $\underline{S}_1$ and $\underline{S}_3$ after spectral shift into the base band.

In accordance with another aspect of the invention, for all stages $\nu$, the reduction in the sampling rate from stage to stage is a constant value $M_\nu = 2$ and the number of complex signals output by each filter bank in each stage is a constant value $L_{84} = 4$, and the frequency multiplex signal for the first stage at the input side is real and the sampling rate at the input of this first stage is cut in half.

Figure 16:
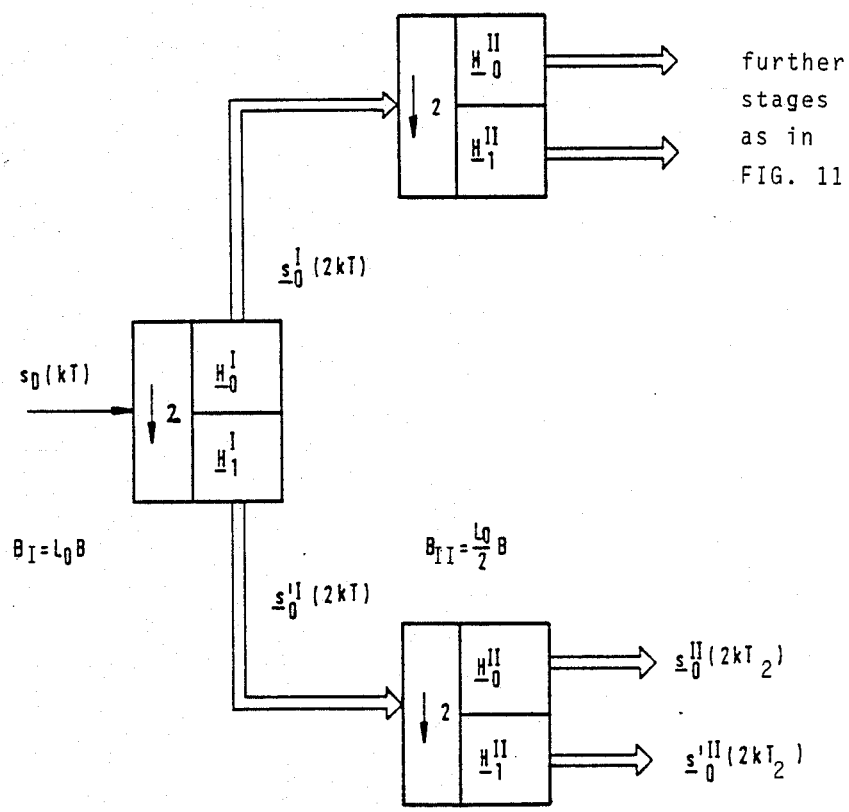
FIG. 16 is a block diagram of the digital filter tree according to another embodiment of the invention.
Figure 17A:
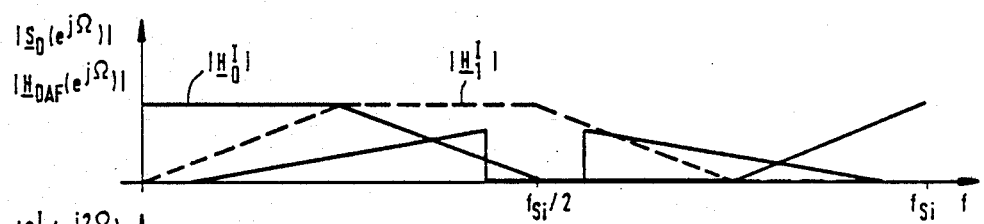
FIGS. 17a and 17b are diagrams of several frequency spectra generated during signal processing by the digital filter tree shown in FIG. 16.

A block circuit which functions in this manner is particularly suitable for integration and is shown in FIG. 16. In this case, all stages are realized exclusively from the two filters $\underline{H}_0$ and $\underline{H}_1$. All blocks are identical with FIG. 13. In stage I the imaginary portion of the input signal is identical to zero. Such a realization is also possible for L'=L_0. It must be emphasized that any scale factor can be employed in the block circuit diagram of FIG. 13. The spectral relationships can be found in FIG. 17a where the transfer function of the prototype filter is the same as that of the prototype filter of FIG. 10a and the signal spectrum is broadened in a corresponding manner over the range from zero to $f_{si}/2$ in correspondence with the number of channels, i.e. for example not equal to a power of two.

Figure 17B:
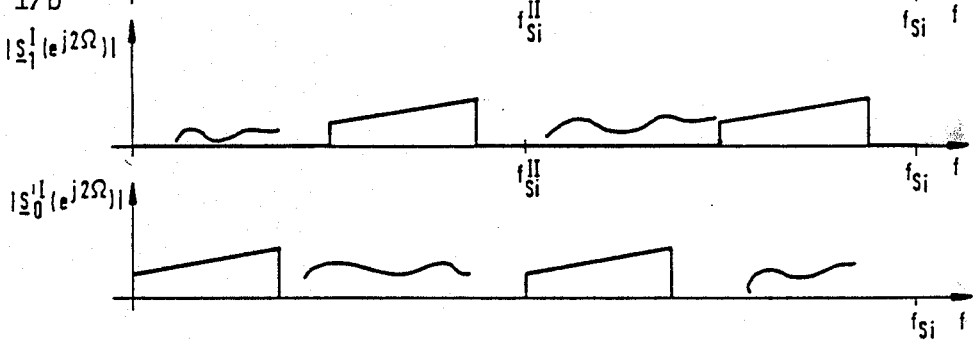

In FIG. 17b, the signal spectra $\underline{S}_0$ and $\underline{S}_1$ are plotted one below the other, with the frequency shift of spectrum $\underline{S}_1$ toward $\underline{S}'_0$ being considered in a further low diagram. The signal spectra identified below FIG. 17b are the spectra of the first stage ($\nu=I$); the frequency spectra of the subsequent stages are shown in FIG. 10c, or they correspond to the above representation of FIG. 17b.

The invention now being fully described, it will be apparent to one of ordinary skill in the art that many changes and modifications can be made thereto without departing from the spirit or scope of the invention as set forth herein.

The present disclosure relates to the subject matter disclosed in German Application No. P 36 10 195.8 of Mar. 26, 1986 and German Application No. P37 32 085.8 of Sept. 24, 1987, the entire specifications of which are incorporated herein by reference.

What is claimed is:

1. A frequency multiplex circuit including a plurality of digital filter cells, each including a digital filter bank for effecting conversion between a frequency multiplexed signal and a plurality of weighted filter signals, and a discrete Fourier transformation means connected to the respective filter bank, the cells being connected to one another in successive stages in an outwardly branching tree structure such that, starting with the first stage, the frequency multiplexed signal is separated into $L_\nu$ individual complex signals appearing on separate lines at the $\nu$th stage, where $\nu=1, 2, \ldots$, the Fourier transformation means of each cell effecting a discrete Fourier transformation between the weighted filter signals of the cell and the $L_\nu$ individual complex signals, and the sampling rate is reduced at the $\nu$th stage by $M_\nu \leq L_\nu$, wherein for all of said cells for each cell of the $\nu$th stage:

the frequency multiplexed signal contains component signals each associated with a respective individual complex signal and having a bandwidth $B_\nu$;

the weighted filter signals have the form $$\underline{V}_\nu(k,q) = \sum_{p=-\infty}^{+\infty} \underline{s}_\nu(k - i_\nu) \cdot \underline{h}(i_\nu) \cdot \exp(j\pi i_\nu/L_\nu)$$

where
$i_\nu = p \cdot L_\nu + q$,
$q = 0, 1, 2, \ldots L_\nu - 1$, and
$i_\nu, p, q = (0, 1, 2, 3, \ldots)$ the frequency multiplexed signal is $\underline{s}_\nu(k)$ and has a sampling rate of $f_{A\nu}$;

$\underline{h}(i_\nu)$ is a coefficient representing a pulse response of a finite length for $i_\nu = 0, 1, 2 \ldots N_\nu - 1$;

the discrete Fourier transformation has the form $$\underline{l}_\nu(kM_\nu) = \sum_{q=0}^{L_\nu - 1} \underline{v}_\nu(kM_\nu, q) \cdot \exp(j2\pi q l_\nu / L_\nu) = DFT\{v_\nu(kM_\nu, q)\}$$

where
$\underline{S}_{l\nu}(kM_\nu)$ represents the individual complex signals and DFT{·} is the discrete Fourier transformation, $M_\nu$ is a sampling rate reduction factor, $M_\nu \leq L_\nu$, and the discrete Fourier transformation involves sampling with respect to every $M_\nu$th value of the weighted filter signals;

each component signal of the frequency multiplexed signal is associated with a respective channel having a channel number, $l_\nu$, and a center channel frequency $f_{l\nu} = l_\nu \cdot B_\nu + B_\nu/2$ and $l_\nu = 0, 1, 2, \ldots L_\nu - 1$, the frequency multiplexed signal is a complex signal, $\underline{s}_D(kT_\nu) = s_{r\nu}(kT_\nu) + js_{i\nu}(kT_\nu)$ with a real portion $Re = s_{r\nu}(kT_\nu)$ and an imaginary portion $Im = -s_{i\nu}(kT_\nu)$, and k is a time factor $= \ldots, -1, 0, +1 \ldots$; and each filter bank in the $\nu$th stage comprising: two chains of $N_\nu - 1$ delay members each having a delay of $T_{\nu+1}$ and each processing a respective portion of the complex signal, where $N_\nu$ is the number of samples of the frequency multiplexed signal associated with each set of weighted filter signal values output by the filter banks of the $\nu$th stage and $T_\nu = 1/f_{A\nu}$; sampling means for sampling the signals associated with each delay member at a rate corresponding to the sampling rate of the frequency multiplexed signal reduced by $M_\nu$; first processing means for effecting conversion between each sample signal associated with a given delay member and an associated weighted sample signal; and second processing means for effecting conversion between selected weighted filter signals and selected weighted sample signals;

for all stages $\nu$, the sampling rate reduction factor $M_\nu = 2$ and the number of individual complex signals appearing on separate lines at the $\nu$th stage $L = 4$ are fixed, with only two signals of the $L_\nu = 4$ being utilized;

the frequency multiplex signal for the first stage $\nu = 1$ at the input side is real and the sampling rate at the input of the first stage is cut in half.

2. A frequency multiplex circuit including a plurality of digital filter cells, each including a digital filter bank for effecting conversion between a frequency multiplexed signal and a plurality of weighted filter signals, and a discrete Fourier transformation means connected to the respective filter bank, the cells being connected to one another in successive stages in an outwardly branching tree structure such that, starting with the first stage, the frequency multiplexed signal is separated into $L_\nu$ individual complex signals appearing on separate lines at the $\nu$th stage, where $\nu = 1, 2, \ldots$, the Fourier transformation means of each cell effecting a discrete Fourier transformation between the weighted filter signals of the cell and the $L_\nu$ individual complex signals, and the sampling rate is reduced at the $\nu$th stage by $M_\nu \leq L_\nu$, wherein for all of said cells for each cell of the $\nu$th stage:

the frequency multiplexed signal contains component signals each associated with a respective individual complex signal and having a bandwidth $B_\nu$;

the weighted filter signals have the form $$\underline{y}_\nu(k,q) = \sum_{p=-\infty}^{+\infty} \underline{s}_\nu(k - i_\nu) \cdot \underline{h}(i_\nu) \cdot \exp(j\pi i_\nu/L_\nu)$$

where
$i_\nu = p \cdot L_\nu + q$,
$q = 0, 1, 2, \ldots L_{\nu-1}$, and
$i_\nu, p, q = (0, 1, 2, 3, \ldots)$
the frequency multiplexed signal is $\underline{s}_\nu(k)$ and has a sampling rate of $f_{A\nu}$;
$\underline{h}(i_\nu)$ is a coefficient representing a pulse response of a finite length for $i_\nu = 0, 1, 2 \ldots N_\nu - 1$;
the discrete Fourier transformation has the form $$\underline{l}_\nu(kM_\nu) = \sum_{q=0}^{L_\nu - 1} \underline{y}_\nu(kM_\nu,q) \cdot \exp(j2\pi\, ql_\nu/L_\nu) = DFT\{\underline{y}_\nu(kM_\nu,q)\}$$

where
$\underline{s}_{l\nu}(kM_\nu)$ represents the individual complex signals and
$DFT\{\cdot\}$ is the discrete Fourier transformation, $M_\nu$ is a sampling rate reduction factor, $M_\nu \leq L_\nu$, and the discrete Fourier transformation involves sampling with respect to every $M\nu$th value of the weighted filter signals.
each component signal of the frequency multiplexed signal is associated with a respective channel having a channel number, $l_\nu$, and a center channel frequency $$f_{l_\nu} = l_\nu \cdot B_\nu + B_\nu/2 \text{ and } l_\nu = 0, 1, 2, \ldots L_\nu - 1,$$

the frequency multiplexed signal is a complex signal, $\underline{s}_D(kT_\nu) = s_{r\nu}(kT_\nu) + js_{i\nu}(kT_\nu)$ with a real portion $Re = s_{r\nu}(kT_\nu)$ and an imaginary portion $Im = s_{i\nu}(kT_\nu)$, and k is a time factor $= \ldots, -1, 0, +1 \ldots$; and each filter bank in the $\nu$th stage comprising: two chains of $N_\nu - 1$ delay members each having a delay of $T_{\nu+1}$ and each processing a respective portion of the complex signal, where $N_\nu$ is the number of frequency multiplexed signal values associated with each set of weighted filter signal values output by the filter banks of the $\nu$th stage and $T_\nu = 1/f_{A\nu}$; sampling means for sampling the signals associated with each delay member at a rate corresponding to the sampling rate of the frequency multiplexed signal reduced by $M_\nu$; first processing means for effecting conversion between each sample signal associated with a given delay member and an associated weighted sample signal; and second processing means for effecting conversion between selected weighted filter signals and selected weighted sample signals; wherein for all stages $\nu$ the sampling rate reduction factor $M_\nu = 2$ and the number of individual complex signals appearing on separate lines at the $\nu$th stage $L_\nu = 4$ are fixed, the first stage ($\nu = 1$) forms a true four-branch system having four output signals $\underline{s}_0(2kT_1)$, $\underline{s}_1(2kT_1)$, $\underline{s}_2(2kT_1)$, $\underline{s}_3(2kT_1)$, are each fed to the subsequent stage, and only two output signals of each of the cells of the next following stages are input to subsequent stages; and the circuit further comprising
a prefilter having an output coupled to the first stage ($\nu = 1$) for producing the complex input signal $\underline{s}_D$ to the first stage by sampling at the rate $2f_{A1}$ from a real frequency multiplex input signal $S_D(kT_0)$, and
means for spectrally offsetting the two partial spectra of $\underline{s}_1$ and $\underline{s}_3$ output by the first stage, which do not come to lie directly in the band 0 to $f_{A1}/4$.

* * * * *